United States Patent [19]
Ueno

[11] Patent Number: 6,104,218
[45] Date of Patent: Aug. 15, 2000

[54] HIGH BREAKDOWN VOLTAGE PUSH-PULL CIRCUIT FOR SEMICONDUCTOR DEVICE

[75] Inventor: Masaji Ueno, Sagamihara, Japan

[73] Assignee: Kabushiki Kaisha Toshiba, Kawasaki, Japan

[21] Appl. No.: 08/993,022

[22] Filed: Dec. 18, 1997

[30] Foreign Application Priority Data

Dec. 20, 1996 [JP] Japan ................................. 8-341125

[51] Int. Cl.[7] ..................................................... H03B 1/00
[52] U.S. Cl. ............................ 327/112; 327/108; 327/111
[58] Field of Search .................................. 327/108, 111, 327/112, 379, 389, 391, 381, 412, 413, 484, 485, 486; 326/26, 27; 361/111, 212

[56] References Cited

U.S. PATENT DOCUMENTS

| | | | |
|---|---|---|---|
| 5,140,194 | 8/1992 | Okitaka | 307/473 |
| 5,444,401 | 8/1995 | Crafts | 327/108 |
| 5,473,271 | 12/1995 | Little et al. | 327/108 |
| 5,659,261 | 8/1997 | Bacrania et al. | 327/112 |

*Primary Examiner*—Kenneth B. Wells
*Assistant Examiner*—Hai L. Nguyen
*Attorney, Agent, or Firm*—Oblon, Spivak, McClelland, Maier & Neustadt, P.C.

[57] ABSTRACT

The chip size of the high breakdown voltage push-pull output circuit for the semiconductor device can be reduced by use of only the low breakdown voltage transistor elements. Between the voltage supply terminal HVCC and the ground terminal GND, the control transistor element (Q1) and the voltage transistor element (Q3) are connected in series and stacked vertically. In the same way, the voltage transistor element (Q4) and the control transistor element (Q2) are connected in series and stacked vertically. Further, the output terminal (OUT) is derived from between the voltage transistor element (Q3) and the voltage transistor element (Q4). The supply voltage of 12V supplied through the voltage supply terminal HVCC is divided as voltages of 6V by the bias circuit BI, and then supplied to the bases of the two voltage transistor elements (Q3 and Q4), respectively. When the output is low, the supply voltage of 12V is divided ½ by the control transistor element (Q1) and the voltage transistor element (Q3). On the other hand, when the output is high, the supply voltage of 12V is divided ½ by the voltage transistor element (Q4) and the control transistor element (Q2). Therefore, it is possible to construct a push-pull circuit with a high breakdown voltage by use of only the low breakdown voltage transistor elements.

19 Claims, 6 Drawing Sheets

18V BREAKDOWN
VOLTAGE Tr
ELEMENT (3.3)

8V BREAKDOWN
VOLTAGE Tr
ELEMENT (1)

HIGH BREAKDOWN VOLTAGE PUSH-PULL CIRCUIT FOR SEMICONDUCTOR DEVICE

BACKGROUND OF THE INVENTION

1. Field of the Invention

The present invention relates to a high breakdown voltage push-pull circuit for a semiconductor device, and more specifically to a high breakdown voltage push-pull circuit for a semiconductor device used for IC or LSI using a high supply voltage.

2. Description of the Prior Art

Conventionally, when transistor elements used for a high breakdown voltage push-pull circuit for a semiconductor device are selected, the transistor elements have been so far selected according to the maximum breakdown voltage of the high breakdown voltage push-pull circuit. In other words, the transistor elements having a collector-emitter breakdown voltage $V_{CEO}$ higher than the maximum supply voltage to be used have been so far used. For instance, when a supply voltage of 12V to 18V is to be used for the high breakdown voltage push-pull circuit for a semiconductor device, the transistor elements having a collector-emitter breakdown voltage $V_{CEO}$ of 18V have been so far selected.

In general, the breakdown voltage of the transistor elements is roughly proportional to the size thereof. Therefore, when the transistor element having a high breakdown voltage is selected, since the area of the transistor element itself is large, there exists a problem in that the chip size thereof also increases. As well understood by FIGS. 5(a) and 5(b), for instance, the area of the 18V breakdown voltage transistor element is about 3.3 times larger than that of the 8V breakdown voltage transistor element. Therefore, as a matter of course, when the number of transistor elements is the same in both, a difference in transistor size between both causes a difference in chip size between both.

Further, in this case, it is seldom that 18V breakdown voltage is required for all the transistor elements. In general, the number of transistor elements required for 18V breakdown voltage is about 10% of the total number of the transistor elements, so that 8V breakdown voltage transistor elements can be used as the remaining 90% transistor elements. However, it is extremely difficult to mix both the 18V breakdown voltage transistor elements and the 8V breakdown voltage transistor elements together during the manufacturing process. This is because there exists a difference in basic structure between both, for instance such as a depth of a diffusion layer required to form the transistor element. In other words, when the depth of the diffusion layer is fitted to the basic structure of one transistor element (e.g., 8V), since the depth thereof does not fit to the other transistor element (e.g., 18V), it is impossible to manufacture both the transistor elements by the same manufacturing process.

SUMMARY OF THE INVENTION

Accordingly, it is the object of the present invention to realize a circuit equivalent to large-sized high-breakdown voltage transistor elements by use of small-sized low breakdown voltage transistor elements, so that a high breakdown voltage can be attained by use of the low breakdown voltage transistor elements manufactured by the process for forming the low breakdown voltage transistor elements. In more detail, for instance, the low breakdown voltage transistor elements used in a rate of about 90% are formed by the manufacturing process of forming the low breakdown voltage transistor elements, and further a circuit equivalent to the high breakdown voltage transistor elements required at a rate of about 10% is realized by use of the low breakdown voltage transistor elements. By doing this, it is possible to obtain a high breakdown voltage push-pull circuit for a semiconductor device to which a high supply voltage can be used, without increasing the chip size.

To achieve the above-mentioned object, the present invention provides a high breakdown voltage push-pull output circuit for a semiconductor device, comprising: a first control transistor element connected between a first voltage supply terminal and an output terminal; a second control transistor element connected between the output terminal and a second voltage supply terminal; a switching circuit for turning on or off said first and second control transistor elements in response to an input signal applied through an input terminal, to switch an output signal derived through the output terminal from a high level to a low level or vice versa; at least one first voltage transistor element connected between the first voltage supply terminal and the output terminal in series to said first control transistor element; at least one second voltage transistor element connected between the output terminal and the second voltage supply terminal in series to said second control transistor element; and a bias circuit for dividing a supply voltage supplied between the first and second voltage supply terminals into a lower voltage, to apply the divided lower voltage to control terminals of said first and second voltage transistor elements, respectively.

Further, the present invention provides a high breakdown voltage push-pull output circuit for a semiconductor device, wherein a supply voltage n-times higher than an collector-emitter breakdown voltage of a single transistor element can be used, by connecting n-units of transistor elements in series so that a voltage divided down from the supply voltage can be supplied between a collector and an emitter of each of the transistor elements.

Further, the present invention provides a high breakdown voltage push-pull output circuit for a semiconductor device having an input terminal for inputting an input signal and an output terminal for outputting an output signal in response to the input signal, both the input terminal and the output terminal being connected between a high voltage side supply terminal and a low voltage side supply terminal, respectively, which comprises: a high voltage side transistor group composed of a plurality of series-connected transistor elements connected between the high voltage side supply terminal and the low voltage side supply terminal, one of the plural transistor elements being a high voltage side switching transistor element and at least one of the remaining transistor elements being a high voltage side bias transistor element, a divided voltage obtained by dividing a voltage between the high voltage side supply terminal and the low voltage side supply terminal being applied to each of the plural transistor elements, the high voltage side switching transistor element being turned on or off at voltage between the high voltage side supply terminal and the low voltage side supply terminal in response to a control signal applied to its own control terminal thereof; a low voltage side transistor group composed of a plurality of series-connected transistor elements connected between the high voltage side supply terminal and the low voltage side supply terminal, one of the plural transistor elements being a low voltage side switching transistor element and at least one of the remaining transistor elements being a low voltage side bias transistor element, a divided voltage obtained by dividing the voltage between the high voltage side supply terminal and the low voltage side supply terminal being applied to each of the plural transistor elements, the low voltage side switching transistor element being turned on or off at voltage between the high voltage side supply terminal and the low voltage side supply terminal in response to a control signal applied to its own control terminal thereof; a switching control circuit for turning on one of said high voltage side transistor group and said low voltage side transistor group and off the other of both, in response to the input signal; and a bias circuit for supplying a divided voltage obtained by dividing the supply voltage applied between the high voltage side supply terminal and the low voltage side supply terminal, to the control terminals of the high voltage side bias transistor element and the low voltage side bias transistor element, respectively.

DETAILED DESCRIPTION OF THE PREFERRED EMBODIMENTS

The embodiments of the high breakdown voltage push-pull circuit for a semiconductor device according to the present invention will be described hereinbelow with reference to the attached drawings.

Figure 1:
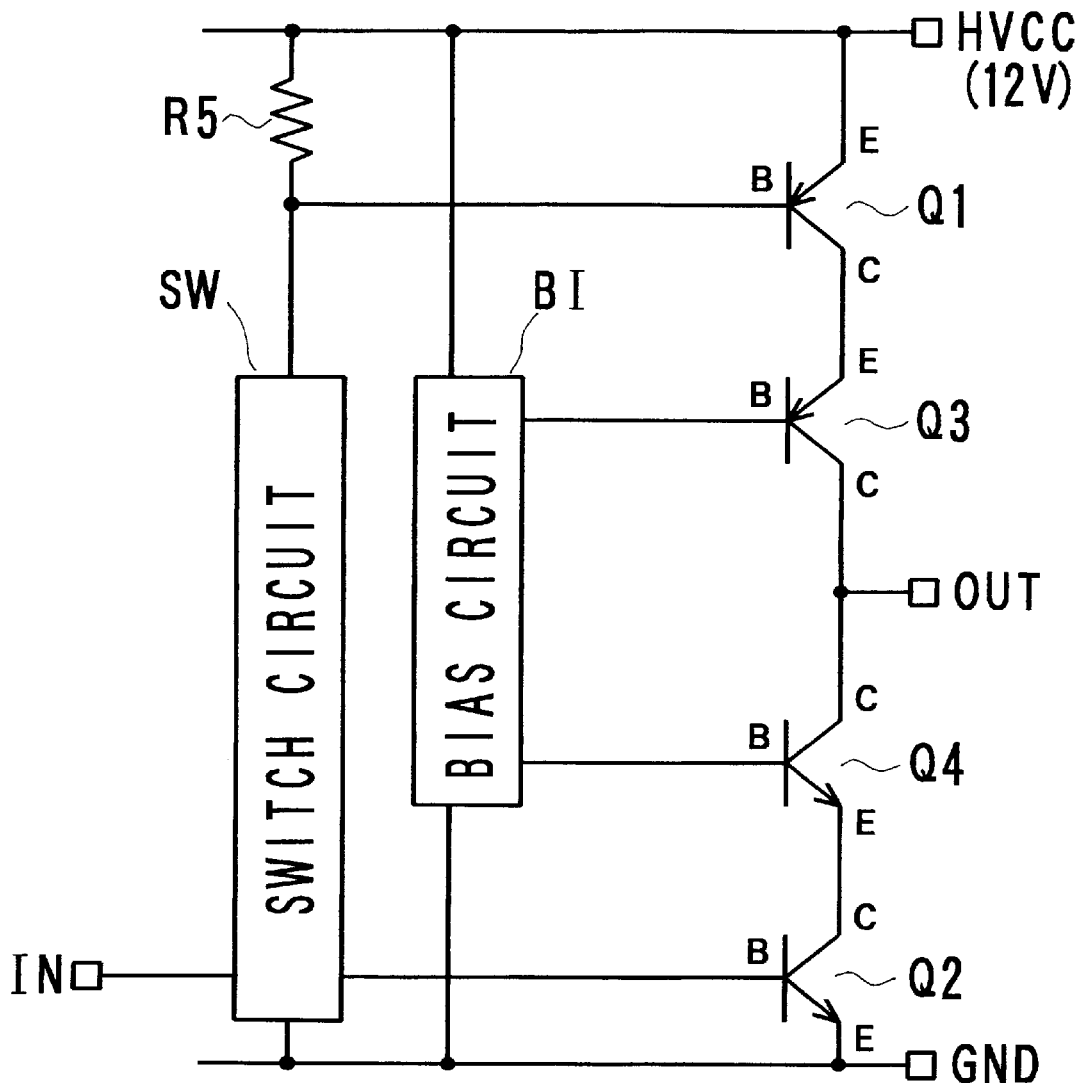
FIG. 1 is a circuit diagram showing a first embodiment of the high breakdown voltage push-pull circuit for a semiconductor device according to the present invention, in which a switch circuit and a bias circuit are both shown by use of a block, respectively.
Figure 2:
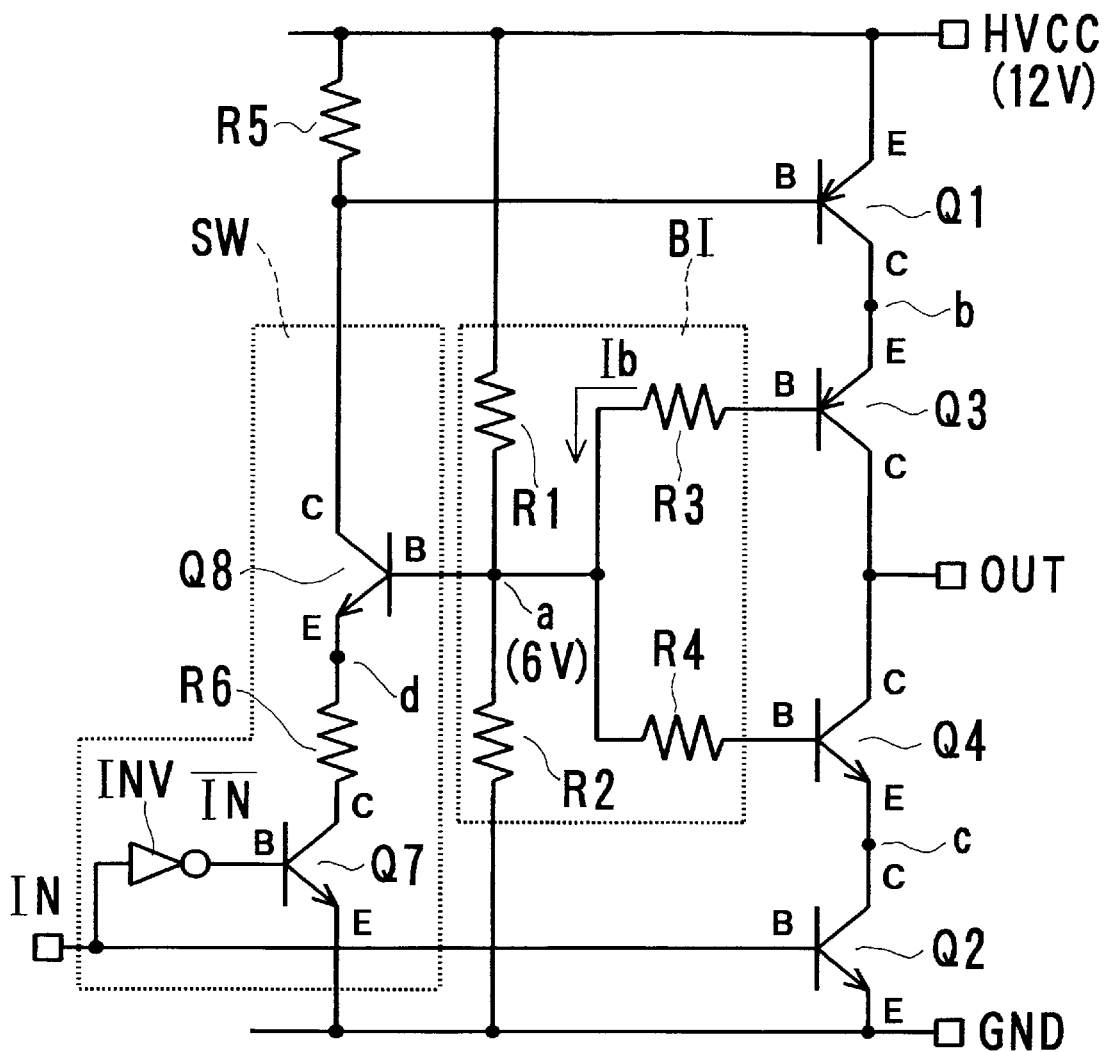
FIG. 2 is a circuit diagram showing the first embodiment of the high breakdown voltage push-pull circuit for a semiconductor device according to the present invention, in which the switch circuit and the bias circuit are both shown by use of transistor elements and/or resistors.

FIGS. 1 and 2 are circuit diagrams showing a first embodiment of the high breakdown voltage push-pull circuit for a semiconductor device, which can output an output voltage twice higher than a rated breakdown voltage of the used transistor elements. Further, FIG. 1 is a circuit diagram in which a bias circuit and a switch circuit are both shown as a block, respectively; and FIG. 2 is a circuit diagram in which the two blocks are shown by transistor elements, resistors and an inversion element.

First, in FIG. 1, the high breakdown voltage push-pull circuit for a semiconductor device according to the present invention will be summarized. As understood with reference to FIG. 1, a voltage supply terminal (a first voltage supply terminal) HVCC is provided on the upper right side thereof, to which a 12V supply voltage is supplied. Further, on the lower side of this voltage supply terminal HVCC, a ground terminal (a second voltage supply terminal) GND is provided.

Between these two voltage supply terminals HVCC and GND, four transistor elements Q1, Q2, Q3 and Q4 are connected in series. Further, an output terminal OUT is provided between the two transistor elements Q3 and Q4. Further, between the voltage supply terminal HVCC and the output terminal OUT, a PNP control transistor element Q1 and a PNP voltage transistor element Q3 are connected in series being stacked in the vertical direction, in such a way that the collector of the control transistor element Q1 is connected to the emitter of the voltage transistor element Q3. In the same way, between the output terminal OUT and the ground terminal GND, an NPN voltage transistor element Q4 and an NPN control transistor element Q2 are connected in series being stacked in the vertical direction, in such a way that the emitter of the voltage transistor element Q4 is connected to the collector of the control transistor element Q2. Here, all these transistor elements Q1, Q2, Q3 and Q4 are all of 8V voltage transistor element having a collector-emitter breakdown voltage $V_{CEO}$ of 8V.

At the middle in FIG. 1, a bias circuit BI is connected between the high voltage supply terminal HVCC and the ground terminal GND. This bias circuit BI divides the supply voltage of 12V supplied through the supply voltage terminal HVCC into 6V, and applies the divided voltage of 6V to both the bases of the two voltage transistor elements Q3 and Q4, respectively.

On the left side in FIG. 1, a resistor R5 and a switch circuit SW are connected between the voltage supply terminal HVCC and the ground terminal GND. This switch circuit SW switches the turn-on/off of the two control transistor elements Q1 and Q2, that is, switches the high/low output level of the high breakdown voltage push-pull output circuit for the semiconductor device. A node between the switch circuit 5 and the resistor R5 is connected to the base of the control transistor element Q1. Further, this switch circuit SW is connected to the base of the control transistor element Q2.

In the high breakdown voltage push-pull output circuit for the semiconductor device shown in FIG. 1, when an input signal applied through an input terminal IN is at a high level, the output signal derived from the output terminal OUT is at a low level. In contrast with this, when the input signal applied through the input terminal IN is at a low level, the output signal derived from the output terminal OUT is at a high level.

The construction of the high breakdown voltage push-pull output circuit for the semiconductor device related to the first embodiment will be described in further detail hereinbelow with reference to FIG. 2, in which an example of the bias circuit BI and the switch circuit SW is shown by use of transistor elements and/or resistors, respectively.

As understood with reference to FIG. 2, the bias circuit BI is composed of four resistors R1 to R4. In more detail, two resistors R1 and R2 are connected in series between the voltage supply terminal HVCC and the ground terminal GND. These two resistors R1 and R2 are composed of the same resistor element (i.e., the same resistance), so that the potential at the node "a" is ½×HVCC (e.g., 6V).

Further, this node "a" is connected to the base of the voltage transistor element Q3 via the resistor R3. Further, this node "a" is connected to the base of the voltage transistor element Q4 via the resistor R4.

The switch circuit shown on the left side in FIG. 2 is composed of a transistor element Q8, a resistor R6, a transistor element Q7, and an inversion element INV. That is, the resistor R5, the switch transistor element Q8, the resistor R6, and the switch transistor element Q7 are all connected in series between the voltage supply terminal HVCC and the ground terminal GND. These switch transistor elements Q7 and Q8 are both NPN transistor elements having a collector-emitter breakdown voltage $V_{CEO}$ of 8V. The base of the switch transistor element Q8 is connected to the node "a". Further, an inversion input /IN of the input signal applied through the input terminal IN is applied to the base of the switch transistor element Q7 via an inversion element INV.

The operation of the high breakdown voltage push-pull output circuit for the semiconductor device shown in FIG. 2 will be described hereinbelow. First, the case where the output signal of the high breakdown voltage push-pull output circuit is at the low level, that is, where the input signal of the input terminal IN is at high level will be explained.

As already explained above, since the input signal of the input terminal IN is high, the control transistor element Q2 is turned on, so that the voltage transistor element Q4 is turned on. Therefore, the potential of the output terminal OUT is roughly at the ground level. Further, since the resistor R4 is connected, it is possible to securely switch the voltage transistor element Q4 from the turn-off status to the turn-on status.

On the other hand, since the input signal of the input terminal IN is high, the signal /IN is low, so that the switch transistor elements Q7 and Q8 are both turned off. Therefore, the two transistor elements Q1 and Q3 are both turned off. Under these conditions, a voltage of 12V is applied to the base of the control transistor element Q1 via the resistor R5. Further, since the voltage at the node "a" is 6V, this voltage of 6V is applied to the base of the voltage transistor element Q3 via the resistor R3. Here, when the base-emitter voltage $V_{BE}$ of the voltage transistor element Q3 is set to a value of the general transistor element of about 0.7V, the potential at a node "b" on the emitter side of the voltage transistor element Q3 is about 6.7V. Therefore, if the potential at the node "b" is about 6.7V, since the voltage between the voltage supply terminal HVCC and the output terminal OUT is about 12V, the collector-emitter voltage $V_{CE}$ of the control transistor element Q1 is about 5.3V. In contrast with this, the collector-emitter voltage $V_{CE}$ of the voltage transistor element Q3 is about 6.7V. Therefore, the collector-emitter voltages $V_{CE}$ of these transistor elements Q1 and Q3 are lower than the collector-emitter breakdown voltage $V_{CEO}$ (8V) of the transistor elements Q1 and Q3.

The above operation is applied to the case where the output signal of the high breakdown voltage push-pull output circuit is at the low level, that is, where the input signal of the input terminal IN is at the high level. Successively, the case where the output signal of the high breakdown voltage push-pull output circuit is at the high level, that is, where the input signal of the input terminal IN is at the low level will be explained.

As described above, since the input signal of the input terminal IN is low and thereby the signal /IN is high, the switch transistor element Q7 is turned on and thereby the switch transistor element Q8 is also turned on, so that control the transistor element Q1 is turned on and thereby the voltage transistor element Q3 is turned on. Under these conditions, since the potential at the node "a" is 6V, the base potential of the switch transistor element Q8 is 6V. Therefore, when the base-emitter voltage $V_{BE}$ of the voltage transistor element Q8 is set to a value of the general transistor element of about 0.7V, the potential at a node "d" on the emitter side of the switch transistor element Q8 is about 5.3V. That is, since the potential at the node "d" is about 5.3V, the voltage between the voltage supply terminal HVCC and the node "d" is about 6.7V. Therefore, when considering the resistance R5, the collector-emitter voltage $V_{CE}$ of the switch transistor element Q8 is at least lower than 6.7V. Here, this value of 6.7V is a value lower than the collector-emitter breakdown voltage $V_{CEO}$ (8V) of the transistor element Q8. On the other hand, the voltage between the node "d" and the ground terminal GND is about 5.3V. Therefore, when considering the resistance R6, the collector-emitter voltage $V_{CE}$ of the switch transistor element Q7 is at least lower than 5.3V. Here, this value of 5.3V is a value lower than the collector-emitter breakdown voltage $V_{CEO}$ (8V) of the switch transistor element Q7.

Further, as described above, since the input signal of the input terminal IN is low, the control transistor element Q2 is turned off and thereby the voltage transistor element Q4 is also off. Under these conditions, since the transistor elements Q1 and Q3 are both turned on, the voltage between the output terminal OUT and the ground terminal GND is about 12V.

Under these conditions, since the potential at the node "a" is 6V, a voltage of 6V is applied to the base of the voltage transistor element Q4 via the resistor R4. Therefore, when the base-emitter voltage $V_{BE}$ of the voltage transistor element Q4 is set to about 0.7V, the potential at a node "c" on the emitter side of the voltage transistor element Q4 is about 5.3V. Here, if the potential at the node "c" is about 5.3V, since the voltage between the ground terminal GND is 12V, the collector-emitter voltage $V_{CE}$ of the voltage transistor element Q4 is about 6.7V. In contrast with this, the collector-emitter voltage $V_{CE}$ of the control transistor element Q2 is about 5.3V. Therefore, the collector-emitter voltages $V_{CE}$ of these transistor elements Q2 and Q4 are lower than the collector-emitter breakdown voltage $V_{CEO}$ (8V) of these transistor elements Q2 and Q4.

As described above, according to the high breakdown voltage push-pull output circuit for the semiconductor device shown in FIG. 2, in spite of the fact that the 8V breakdown voltage transistor elements are used, it is possible to output a voltage signal of 12V from the output terminal OUT by using the supply voltage of 12V supplied to the voltage supply terminal HVCC. In other words, in spite of the fact that the chip size is reduced by using the 8V breakdown voltage transistor elements of smaller transistor element area, it is possible to construct the high breakdown voltage push-pull output circuit for the semiconductor device having an output voltage of 12V. Further, in this embodiment, the reason why the supply voltage is determined as 12V is that a design margin or ripples are taken into account. From the theoretical standpoint, it is possible to use a supply voltage of 16V, which is twice higher than the collector-emitter breakdown voltage $V_{CEO}$ (8V) of the transistor elements.

Here, the chip area of the transistor elements used for the present embodiment will be calculated. For instance, the area thereof will be calculated on the assumption that the high breakdown voltage push-pull output circuit for the semiconductor device needs 100 units of transistor elements. In the high breakdown voltage push-pull output circuit for the semiconductor device, although the 18V breakdown voltage transistor elements are required for 10% of the total number of the transistor elements, the 8V breakdown voltage transistor elements are sufficient for the remaining 90% of the total number of the transistor elements. In this case, however, since it is extremely difficult to mix both the 18V breakdown voltage transistor elements and the 8V breakdown voltage transistor elements together during the manufacturing process, it is necessary to construct the high breakdown voltage push-pull output circuit for the semiconductor device by use of 100 units of only the 18V breakdown voltage transistor elements. In this case, since the area of the 18V breakdown voltage transistor element is about 3.3 times larger than that of the 8V breakdown voltage transistor element, when the area required to form the transistor elements is calculated on the basis of this area ratio; that is, by setting the area of the 18V breakdown voltage transistor elements to 3.3 of the area of the 8V breakdown voltage transistor elements, the following value can be obtained:

3.3×100 units=330

On the other hand, as with the case of the first embodiment, when an equivalent circuit is realized by combining the 8V breakdown voltage transistor elements, the required area is as follows: Here, however, it is necessary to use the transistor elements whose number is three times larger than that of the usual push-pull circuit, in order to construct the equivalent circuit as shown in FIG. 2.

1×3 times×10 units+1×90 units=120

As understood by above, according to the high breakdown voltage push-pull output circuit for the semiconductor device according to the present invention, it is possible to reduce the area of the transistor elements by about ⅓ times. In other words, it is possible to reduce the chip size down to about ⅓. Further, when considering the element area, the resistance elements can be disregarded. This is because the size of the resistors is very small in comparison with that of the transistor element.

Figure 3:
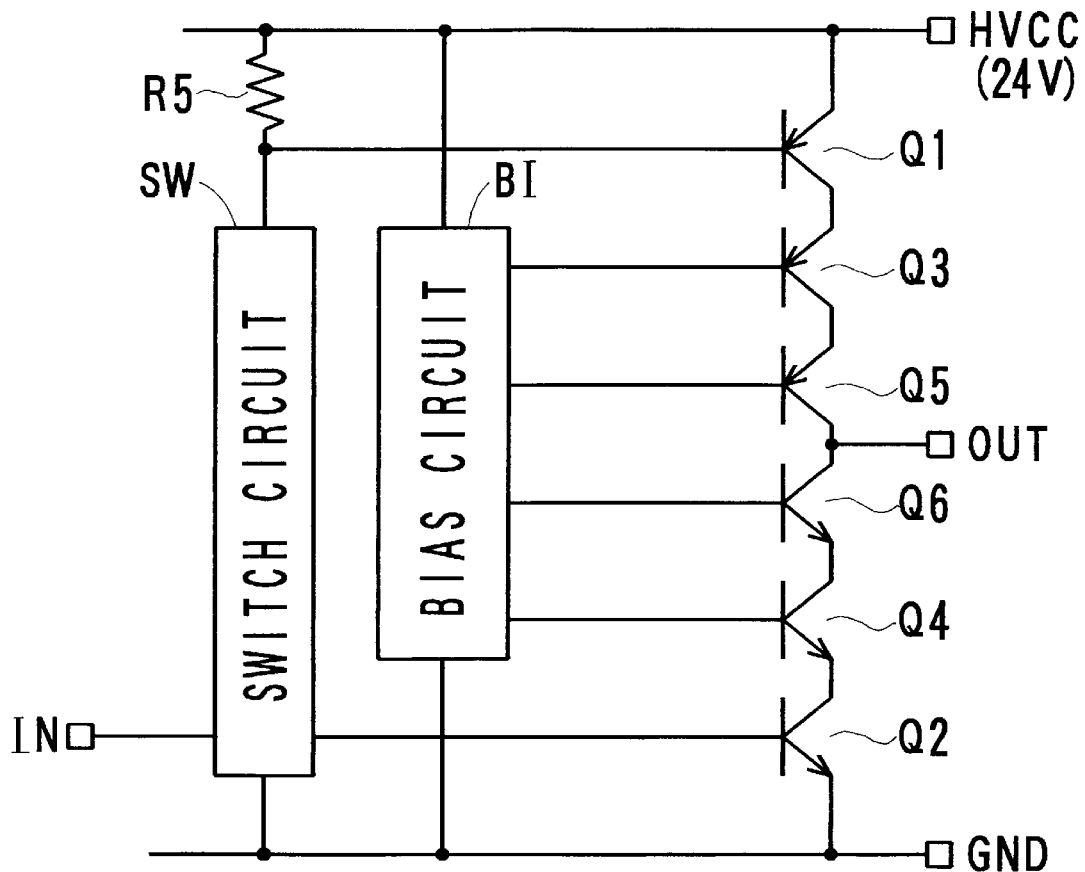
FIG. 3 is a circuit diagram showing a second embodiment of the high breakdown voltage push-pull circuit for a semiconductor device according to the present invention, in which a switch circuit and a bias circuit are both shown by use of a block, respectively.
Figure 4:
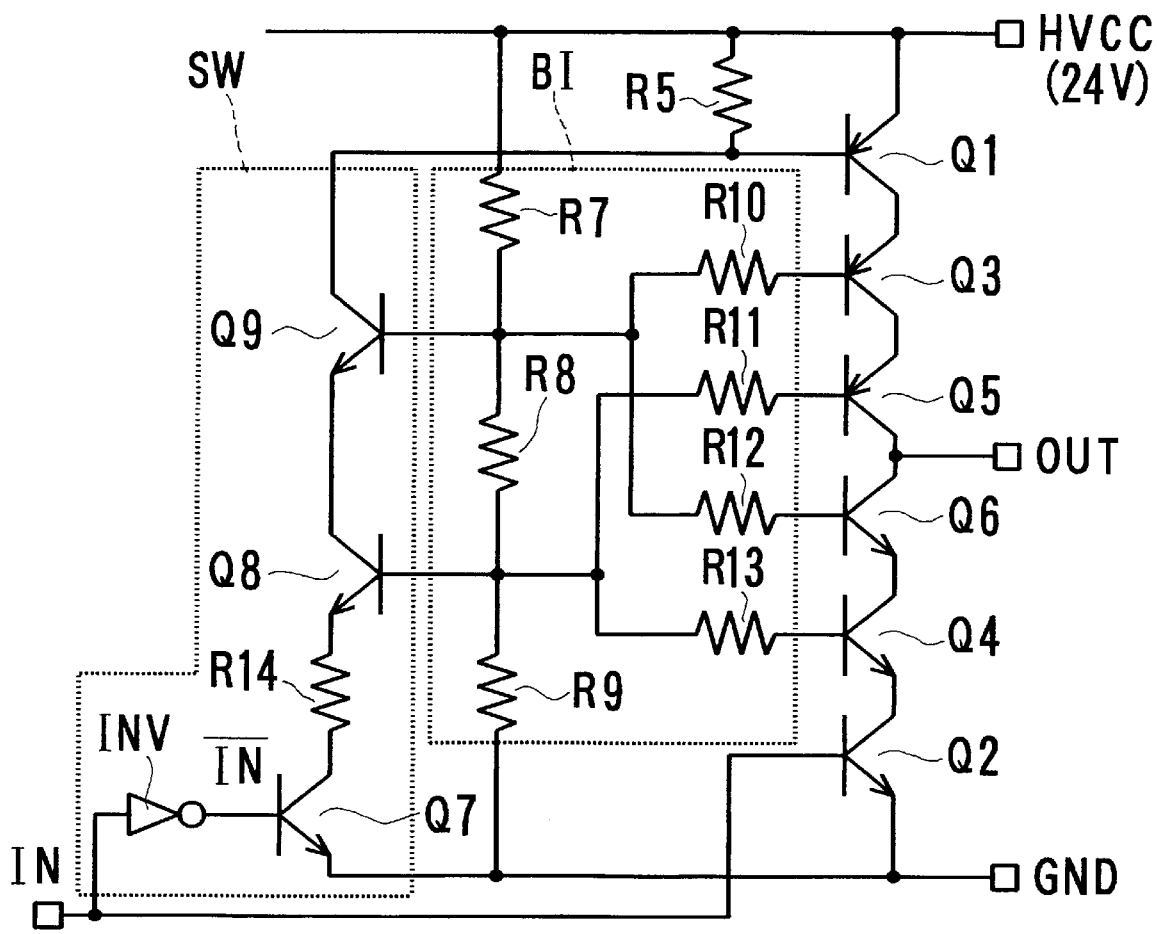
FIG. 4 is a circuit diagram showing the second embodiment of the high breakdown voltage push-pull circuit for a semiconductor device according to the present invention, in which the switch circuit and the bias circuit are both shown by use of transistor elements and/or resistors.

FIGS. 3 and 4 are circuit diagrams showing a second embodiment of the high breakdown voltage push-pull circuit for a semiconductor device according to the present invention, which can output an output voltage three times higher than a rated breakdown voltage of the formed transistor elements. Further, FIG. 3 is a circuit diagram in which a bias circuit and a switch circuit are shown as a block, respectively; and FIG. 4 is a circuit diagram in which the two blocks are shown by transistor elements, resistors and/or an inversion element respectively.

As understood with reference to FIG. 3, in this second embodiment, two series connected voltage transistor elements are connected on both the high and low level sides, respectively. Therefore, three-stage transistor elements in total are stacked in the vertical direction in total, being different from the first embodiment.

In more detail, between the voltage supply terminal HVCC and the output terminal OUT, a control transistor element Q1 and two voltage transistor elements Q3 and Q5 are connected in series and stacked in the vertical direction. In the same way, between the output terminal OUT and the ground terminal GND, two voltage transistor elements Q6 and Q4 and a control transistor element Q2 are connected in series and stacked in the vertical direction.

The bias circuit BI is a circuit for dividing the supply voltage supplied through the voltage supply terminal HVCC and for supplying the divided voltages to the bases of the transistor elements Q3 to Q4, respectively. In more detail, the bias circuit BI supplies a base voltage of ⅔ of the HVCC voltage to the bases of the voltage transistor elements Q3 and Q6, and further a base voltage of ⅓ of the HVCC voltage to the bases of the voltage transistor elements Q5 and Q4, respectively.

The switch circuit SW is a circuit for switching the output of the high breakdown voltage push-pull output circuit for the semiconductor device from a high level to a low level or vice versa, by switching the turn-on/off of the control transistor elements Q1 and Q2 on the basis of the input signal applied through the input terminal IN.

As understood with reference to FIG. 4, the bias circuit BI is composed of seven resistors R7 to R13. Here, the resistor R7, the resistor R8 and the resistor R9 have the same resistor (i.e., the same resistance value) so as to divide the supply voltage supplied through the voltage supply terminal HVCC ⅓ by ⅓.

The switch circuit SW is composed of three transistor elements Q7 to Q9, a resistor R14, and an inversion element INV. To each of the bases of the two transistor elements Q9 to Q8, voltages divided by the bias circuit BI ⅓ by ⅓ are applied as the base voltage, respectively.

As described above, according to the second embodiment of the high breakdown voltage push-pull output circuit for the semiconductor device, since three-stage series connected transistor elements are stacked in the vertical direction between the voltage supply terminal HVCC and the output terminal OUT, between the output terminal OUT and the ground terminal GND, and between the voltage supply terminal (HVCC) side and the ground terminal (GND) side of the switch circuit SW, respectively, it is possible to use a supply voltage three times higher than the collector-emitter breakdown voltage $V_{CEO}$ of the transistor elements. For instance, when the transistor elements having the collector-emitter breakdown voltage $V_{CEO}$ of 8V are used, a supply voltage up to 24V which is three times higher than the breakdown voltage of 8V can be supplied from the voltage supply terminal HVCC. Therefore, as shown in FIGS. 3 and 4, when the supply voltage of 24V is used, it is possible to obtain an output voltage of 24V.

Further, without being limited only to the above-mentioned embodiments, the present invention can be modified in various ways. For instance, when the transistor elements are stacked four stages or five stages or more in the vertical direction, it is possible to construct a still higher breakdown voltage push-pull output circuit for the semiconductor device. In this case, the supply voltage is divided by the bias circuit BI into a number which corresponds to the number of the vertically stacked series-connected transistor elements.

Further, it is not necessarily to divide the supply voltage uniformly by the bias circuit BI, and to supply the divided voltage uniformly to the bases of the transistor elements. That is, it is possible to design the bias circuit in such a way that the uniform collector-emitter voltages $V_{CE}$ of the transistor elements can be obtained under consideration of the base-emitter voltages $V_{BE}$ of the transistor elements to be used. Further, in the above-mentioned embodiments, FIGS. 2 and 4 show the bias circuit BI and the switch circuit SW only by way of example, so that the high breakdown voltage push-pull output circuit for the semiconductor device according to the present invention can be realized by use of other bias and switch circuits having the same functions as described above.

Figure 4A:
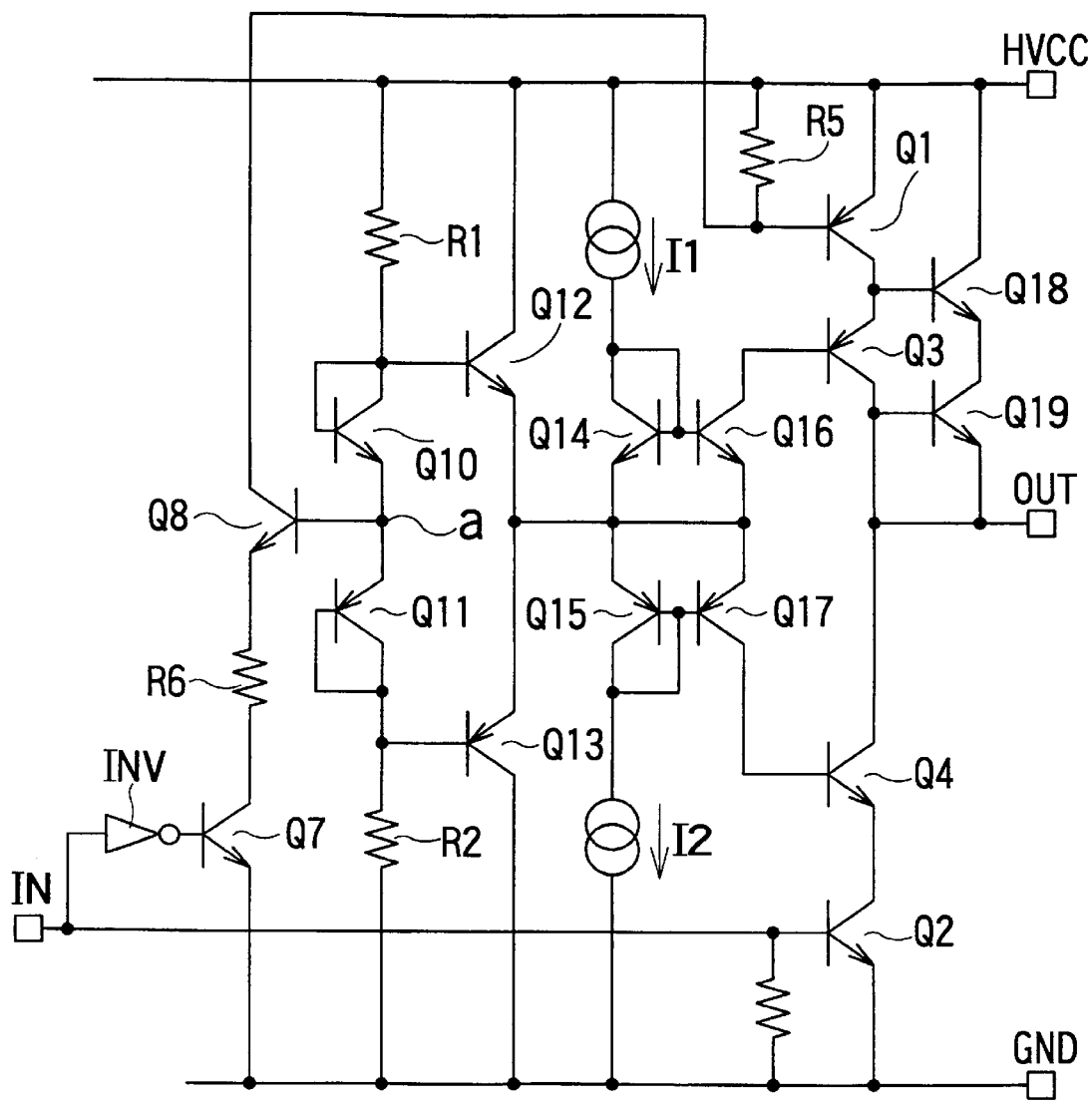
FIG. 4A is a circuit diagram showing a modification of the high breakdown voltage push-pull circuit for a semiconductor device shown in FIG. 2.
Figure 5A:
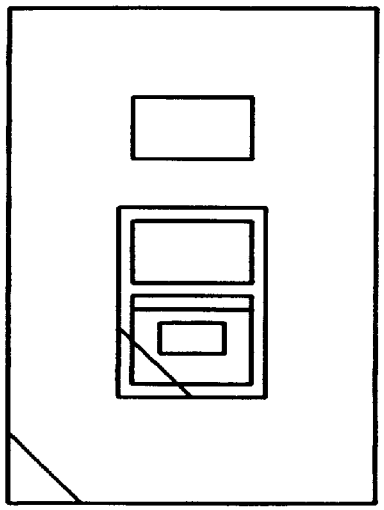
FIGS. 5(a) and 5(b) are illustrations for assistance in explaining a ratio in area between an 18V breakdown transistor element and an 8V breakdown transistor element.
Figure 5B:
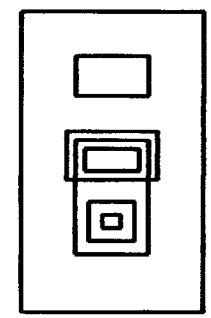

FIG. 4A shows a modification of the switch circuit and the bias circuit of the first embodiment. In this modification, four transistors Q10 to Q13 are additionally connected, to prevent the voltage at the node "a" from being changed by the base current Ib of the transistor element Q8 (shown in FIG. 2) connected to the node "a". As a result, it is possible to maintain the voltage of the node "a" at (HVCC)/2. Further, as shown in FIG. 4A, two constant current circuits I1 and I2 are connected, and in addition four transistor elements Q14 to Q17 are so connected as to construct a current mirror circuit. As a result, it is possible to maintain the base current Ib at a constant value, so that the power consumption thereof can be reduced. Further, in FIG. 4A, two transistor elements Q18 and Q19 are connected as a Darlington amplifier circuit. As a result, it is possible to compensate for the two PNP type transistors Q1 and Q3 whose characteristics are relatively unstable by use of the two NPN type transistors Q18 and Q19 whose characteristics are relatively stable. In more detail, in general, when some PNP type transistor elements and some NPN type transistor elements are formed together on the same semiconductor substrate, there exists the case where the stability of the characteristics of the PNP type transistor elements deteriorates in comparison with those of the NPN type transistor elements. This is because since the base regions of the NPN type transistor elements are formed in the thickness direction of the substrate in the manufacturing process, the widths of the base region of the NPN type transistor elements can be controlled relatively easily. In comparison with this, since the base regions of the PNP type transistor elements are formed in the surface direction of the substrate in the manufacturing process, the widths of the base region of the PNP type transistor elements are relatively difficult to be controlled. The above-mentioned problem can be solved by providing the two NPN type transistor elements Q18 and Q19.

As described above, according to the present invention, a high breakdown voltage push-pull output circuit for the semiconductor device can be realized by use of only the low breakdown voltage transistor elements. Therefore, in spite of the high breakdown voltage push-pull circuit, it is possible to reduce the chip size thereof.

What is claimed is:

1. A high breakdown voltage push-pull output circuit for a semiconductor device, comprising:
   a first control transistor element connected between a first voltage supply terminal and an output terminal;
   a second control transistor element connected between the output terminal and a second voltage supply terminal;
   a switching circuit for turning on or off said first and second control transistor elements in response to an input signal applied through an input terminal, to switch an output signal derived through the output terminal from a high level to a low level or vice versa, said switching circuit including an input transistor element having a control terminal to which the input signal is applied and at least one switching voltage transistor element connected in series to said input transistor element;
   a plurality of first voltage transistor elements connected between the first voltage supply terminal and the output terminal in series to said first control transistor element;
   a plurality of second voltage transistor elements connected between the output terminal and the second voltage supply terminal in series to said second control transistor element, the number of said switching voltage transistor elements being the same as the number of said first voltage transistor elements; and
   a bias circuit for dividing a supply voltage supplied between the first and second voltage supply terminals into a lower voltage, to apply the divided lower voltage to control terminals of said first and second voltage transistor elements, respectively.

2. The high breakdown voltage push-pull output circuit for a semiconductor device of claim 1, wherein the supply voltage is supplied from said bias circuit to a control terminal of said at least one switching voltage transistor element.

3. A high breakdown voltage push-pull output circuit for a semiconductor device, comprising:
   a first control transistor element connected between a first voltage supply terminal and an output terminal;
   a second control transistor element connected between the output terminal and a second voltage supply terminal;
   a switching circuit for turning on or off said first and second control transistor elements in response to an input signal applied through an input terminal, to switch an output signal derived through the output terminal from a high level to a low level or vice versa:
   a first voltage transistor element connected between the first voltage supply terminal and the output terminal in series to said first control transistor element;
   a second voltage transistor element connected between the output terminal and the second voltage supply terminal in series to said second control transistor element; and
   a bias circuit for dividing a supply voltage supplied between the first and second voltage supply terminals into a lower voltage, to apply the divided lower voltage to control terminals of said first and second voltage transistor elements, respectively,
   wherein said bias circuit comprises:
   a first resistance having one end connected to said first voltage supply terminal;
   a first bias transistor element having an input terminal connected to the other end of said first resistance and a control terminal of said first bias transistor;
   a second bias transistor element having an input terminal connected to an output terminal of said first bias transistor element;
   a second resistance having one end connected to an output terminal and a control terminal of said second bias transistor element and the other end connected to said second voltage supply terminal;
   a third bias transistor element having an input terminal connected to said first voltage supply terminal and a control terminal connected to the input terminal of said first bias transistor element; and
   a fourth bias transistor element having an input terminal connected to an output terminal of said third bias transistor element, a control terminal connected to an output terminal of said second transistor element and an output terminal connected to said second voltage supply terminal.

4. The high breakdown voltage push-pull output circuit for a semiconductor device of claim 3, further comprising:
   a first constant current circuit having an input terminal connected to said first voltage supply terminal;
   a first mirror transistor element having an input terminal connected to an output terminal of said first constant current circuit and a control terminal of said first mirror transistor element;
   a second mirror transistor element having an input terminal connected to an output terminal of said first mirror transistor element;
   a second constant current circuit having an input terminal connected to an output terminal and a control terminal of said second mirror transistor element and an output terminal connected to said second voltage supply terminal;
   a third mirror transistor element having an input terminal connected to a control terminal of said first voltage transistor element and a control terminal connected to the control terminal of said first mirror transistor element; and a fourth mirror transistor element having an input terminal connected to an output terminal of said third mirror transistor element, a control terminal connected to the control terminal of said second mirror transistor element and an output terminal connected to control terminal of said second voltage transistor element.

5. A high breakdown voltage push-pull output circuit for a semiconductor device having an input terminal for inputting an input signal and an output terminal for outputting an output signal in response to the input signal, both the input terminal and the output terminal being connected between a high voltage side supply terminal and a low voltage side supply terminal, respectively, which comprises:

a high voltage side transistor group having a plurality of series-connected transistor elements connected between the high voltage side supply terminal and the output terminal, one of the plural transistor elements being a high voltage side switching transistor element and at least one of the plural transistor elements being a high voltage side bias transistor element, the high voltage side switching transistor element being turned on or off at voltage between the high voltage side supply terminal and the low voltage side supply terminal in response to a control signal applied to its own control terminal thereof;

a low voltage side transistor group having a plurality of series-connected transistor elements connected between the output terminal and the low voltage side supply terminal, one of the plural transistor elements being a low voltage side switching transistor element and at least one of the plural transistor elements being a low voltage side bias transistor element, the low voltage side switching transistor element being turned on or off at voltage between the high voltage side supply terminal and the low voltage side supply terminal in response to a control signal applied to its own control terminal thereof;

a switching control circuit for turning on one of said high voltage side switching transistor element and said low voltage side switching transistor element and for turning off the other of said high voltage side switching transistor element and said low voltage side switching transistor element, in response to the input signal, said switching control circuit having a plurality of series-connected transistor elements connected between the high voltage side supply terminal and the low voltage side supply terminal, one of the plural transistor elements being a switching transistor element of said switching control circuit and at least one of the plural transistor elements being a switching bias transistor element of said switching control circuit, the switching transistor element of said switching control circuit being turned on or off in response to the input signal applied to its own control terminal thereof, to turn on or off the high voltage side switching transistor element; and a bias circuit for supplying a divided voltage obtained by dividing the supply voltage applied between the high voltage side supply terminal and the low voltage side supply terminal, to the control terminals of the high voltage side bias translator element, the low voltage side bias transistor element and the switching transistor element of said switching control circuit, respectively.

6. The high breakdown voltage push-pull output circuit for a semiconductor device of claim 5, wherein said bias circuit comprises two same resistances connected in series between the high voltage side supply terminal and the low voltage side supply terminal, for obtaining the divided voltage.

7. The high breakdown voltage push-pull output circuit for a semiconductor device of claim 5, wherein the number of each of the high voltage side bias transistor elements and the low voltage side bias transistor elements is one.

8. The high breakdown voltage push-pull output circuit for a semiconductor device of claim 5, wherein the number of each of the high voltage side bias transistor elements and the low voltage side bias transistor elements is two.

9. A high breakdown voltage push-pull output circuit for a semiconductor device, comprising:

a first control transistor element connected between a first voltage supply terminal and an output terminal;

a second control transistor element connected between the output terminal and a second voltage supply terminal;

a switching circuit for turning on or off said first and second control transistor elements in response to an input signal applied through an input terminal, to switch an output signal derived through the output terminal from a high level to a low level or vice versa, said switching circuit including an input transistor element having a control terminal to which the input signal is applied and a switching voltage transistor element connected in series to said input transistor element;

at least one first voltage transistor element connected between the first voltage supply terminal and the output terminal in series to said first control transistor element;

at least one second voltage transistor element connected between the output terminal and the second voltage supply terminal in series to said second control transistor element; and a bias circuit for dividing a supply voltage supplied between the first and second voltage supply terminals into a divided lower voltage, to apply the divided lower voltage to control terminals of said first voltage transistor element, said second voltage transistor element and said switching voltage element, respectively.

10. The high breakdown voltage push-pull output circuit for a semiconductor device of claim 9, wherein the number of each of said at least one first and second voltage transistor elements is one.

11. The high breakdown voltage push-pull output circuit for a semiconductor device of claim 10, wherein said bias circuit comprises:

a first resistance having one end connected to the first voltage supply terminal and the other end connected to an output node for supplying the divided lower voltage; and a second resistance having one end connected to the output node and the other end connected to the second voltage supply terminal.

12. The high breakdown voltage push-pull output circuit for a semiconductor device of claim 11, wherein the value of said first resistance is the same as the value of said second resistance.

13. The high breakdown voltage push-pull output circuit for a semiconductor device of claim 11, which said bias circuit further comprises:

a third resistance having one end connected to the control terminal of the first voltage transistor element and the other end connected to the output node of the bias circuit; and a fourth resistance having one end connected to the control terminal of the second voltage transistor element and the other end connected to the output node of the bias circuit.

14. The high breakdown voltage push-pull output circuit for a semiconductor device of claim 13, further comprising:

a fifth resistance having one end connected to the first voltage supply terminal and the other end connected to a control terminal of the first control transistor element.

15. The high breakdown voltage push-pull output circuit for a semiconductor device of claim 9, wherein the number of each of said at least one first and second voltage transistor elements is plural.

16. The high breakdown voltage push-pull output circuit for a semiconductor device of claim 15, wherein said bias circuit divides the supply voltage into the number decided by the total number of said first control transistor element and said first voltage transistor element.

17. The high breakdown voltage push-pull output circuit for a semiconductor device of claim 16, wherein said bias circuit comprises a plurality of resistances.

18. The high breakdown voltage push-pull output circuit for a semiconductor device of claim 17, wherein the number of said switching voltage transistor elements is the same as the number of said first voltage transistor elements.

19. The high breakdown voltage push-pull output circuit for a semiconductor device of claim 17, wherein the number of said switching voltage transistor elements is the same as the number of said resistances of said bias circuit.

* * * * *